(12) United States Patent
Far et al.

(10) Patent No.: US 10,920,551 B2
(45) Date of Patent: Feb. 16, 2021

(54) GEOMECHANICAL MODEL OF STRESSES ON AN ORTHORHOMBIC MEDIA

(71) Applicant: Halliburton Energy Services, Inc., Houston, TX (US)

(72) Inventors: Mehdi Eftekhari Far, Humble, TX (US); John Andrew Quirein, Georgetown, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 378 days.

(21) Appl. No.: 15/527,584

(22) PCT Filed: Dec. 17, 2014

(86) PCT No.: PCT/US2014/070878
§ 371 (c)(1),
(2) Date: May 17, 2017

(87) PCT Pub. No.: WO2016/099488
PCT Pub. Date: Jun. 23, 2016

(65) Prior Publication Data
US 2017/0321531 A1    Nov. 9, 2017

(51) Int. Cl.
*E21B 43/26*    (2006.01)
*G01V 99/00*    (2009.01)
*G06F 30/20*    (2020.01)

(52) U.S. Cl.
CPC ............ *E21B 43/26* (2013.01); *G01V 99/005* (2013.01); *G06F 30/20* (2020.01)

(58) Field of Classification Search
CPC .... E21B 43/26; G01V 99/005; G06F 17/5009
See application file for complete search history.

(56) References Cited

U.S. PATENT DOCUMENTS

| | | | |
|---|---|---|---|
| 2010/0312534 A1* | 12/2010 | Xu | G01V 1/50 703/2 |
| 2011/0022320 A1 | 1/2011 | Abousleiman et al. | |
| 2011/0125471 A1* | 5/2011 | Craig | E21B 43/26 703/6 |

(Continued)

OTHER PUBLICATIONS

Bagheri, M. et al., "Modeling of Geomechanics in Naturally Fractured Reservoirs," Society of Petroleum Engineers, SPE 93083, pp. 1-12 (Year: 2005).*

(Continued)

*Primary Examiner* — Rehana Perveen
*Assistant Examiner* — Steven W Crabb
(74) *Attorney, Agent, or Firm* — John W. Wustenberg; Baker Botts L.L.P.

(57) ABSTRACT

In accordance with some embodiments of the present disclosure, a geomechanical model of the stresses on an orthorhombic media for use during a subterranean operation is disclosed. The method includes retrieving a stiffness coefficient matrix for a formation to be fractured and generating a geomechanical model of the formation based on a set of natural fractures and an anisotropic behavior of the formation. The method additionally includes calculating a mechanical property of the formation based on the model and the stiffness coefficient matrix. The method further includes fracturing the formation with a fracturing fluid, a pressure of the fracturing fluid based on the mechanical property.

20 Claims, 11 Drawing Sheets

(56) References Cited

U.S. PATENT DOCUMENTS

| | | | |
|---|---|---|---|
| 2011/0182144 A1* | 7/2011 | Gray | G01V 1/30 367/75 |
| 2011/0276318 A1 | 11/2011 | Segal et al. | |
| 2012/0158380 A1 | 6/2012 | Hajibeygi et al. | |
| 2016/0290113 A1* | 10/2016 | Kisra | E21B 47/00 |
| 2017/0067337 A1* | 3/2017 | Havens | E21B 47/16 |

OTHER PUBLICATIONS

Cheadle, S. P., Brown, R. J., and Lawton, D. C., 1991, Orthorhombic anisotropy: A physical seismic modeling study. Geophysics, 56(10), 1603-1613; 27 pages, 1991.

Far, M. E., Hardage, B., and Wagner, D., 2014, Fracture parameter inversion for Marcellus shale. Geophysics, 79, C55-C63; 9 pages, 2014.

Higgins, S. M., Goodwin, S. A., Bratton, T. R., and Tracy, G. W., 2008, Anisotropic stress models improve completion design in the Baxter Shale. SPE Annual Technical Conference and Exhibition. Society of Petroleum Engineers, SPE 115736; 10 pages, 2008.

Lempriere, B.M., 1968, Poisson's ratio in orthotropic materials, AIAA Journal, 6 (11), 2226-2227; 2 pages, 1968.

Mahmoudian, F., Margrave, G. F., Daley, P. F., Wong, J., and Henley, D. C., 2014, Estimation of elastic stiffness coefficients of an orthorhombic physical model using group velocity analysis on transmission data. Geophysics, 79 (1), R27 -R39; 13 pages, 2014.

Musgrave, M.J.P., 1970, Crystal acoustics. San Francisco: Holden Day; 25 pages, 1970.

Nye, J.F., 1985, Physical Properties of Crystals, Oxford University Press, Oxford; 347 pages, 1985.

Schoenberg, M., and K. Helbig, 1997, Orthorhombic media: Modeling elastic wave behavior in a vertically fractured earth: Geophysics, 62, 1954-1974; 21 pages, 1997.

Thomsen, L., 1986, Weak elastic anisotropy. Geophysics 51 (10), 1954-1966; 13 pages, 1986.

Thomsen, L., 2002, Understanding Seismic Anisotropy in Exploration and Exploitation: SEG 2010, Distinguished Instructor Short Course; 1 page, 2002.

Franquet, J. A., and E. F. Rodriguez. "Orthotropic Horizontal Stress Characterization From Logging and Core Derived Acoustic Anisotropies." 46th US Rock Mechanics/Geomechanics Symposium. American Rock Mechanics Association, 2012; 9 pages, 2012.

Rutqvist, J., et al. "Estimating maximum sustainable injection pressure during geological sequestration of $CO_2$ using coupled fluid flow and geomechanical fault-slip analysis." Energy Conversion and Management 48.6 (2007): 1798-1807; 10 pages, 2007.

Espinoza, D. N., et al. "Measurement and modeling of adsorptive-poromechanical properties of bituminous coal cores exposed to $CO_2$: Adsorption, swelling strains, swelling stresses and impact on fracture permeability." International Journal of Coal Geology 134 (2014): 80-95; 16 pages.

International Search Report and Written Opinion for PCT Patent Application No. PCT/US2014/070878, dated Jun. 10, 2015; 9 pages.

International Preliminary Report on Patentability for PCT Patent Application No. PCT/US2014/070878, dated Jun. 29, 2017; 6 pages.

* cited by examiner

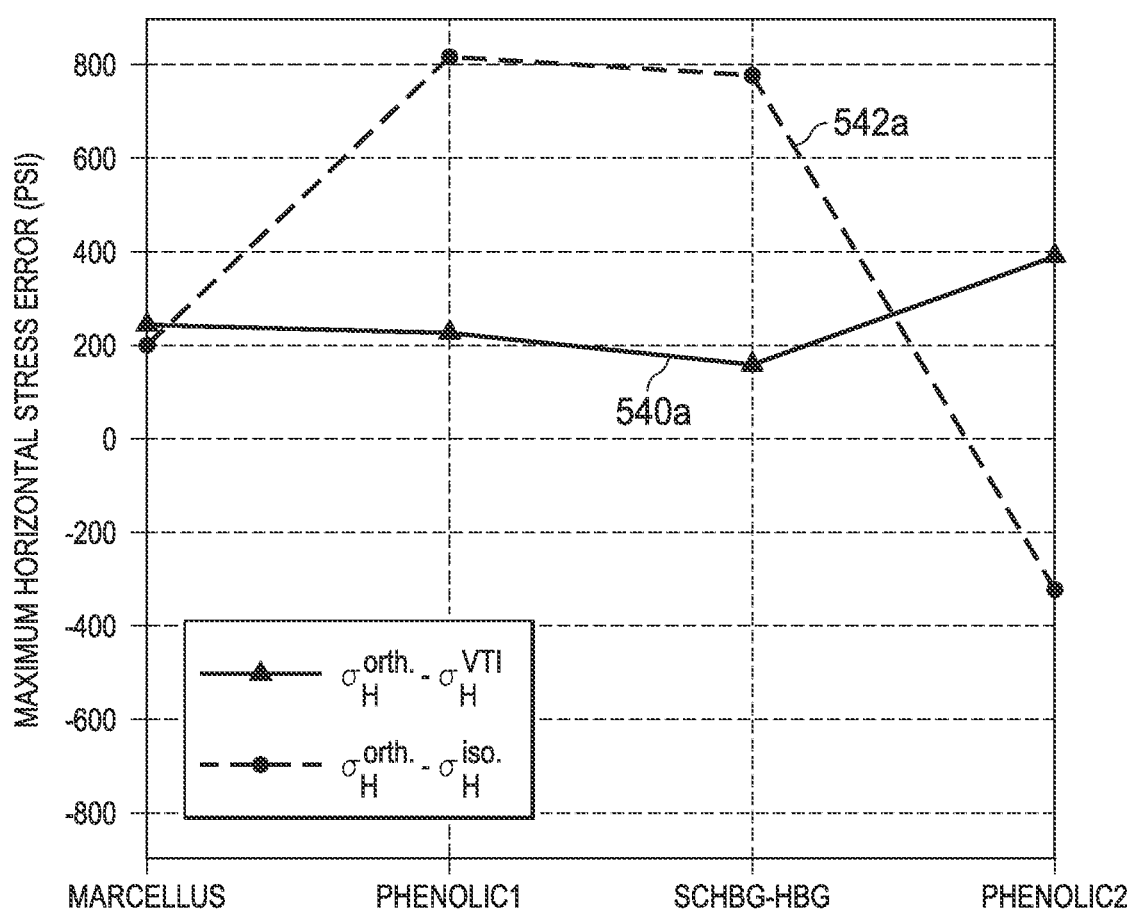

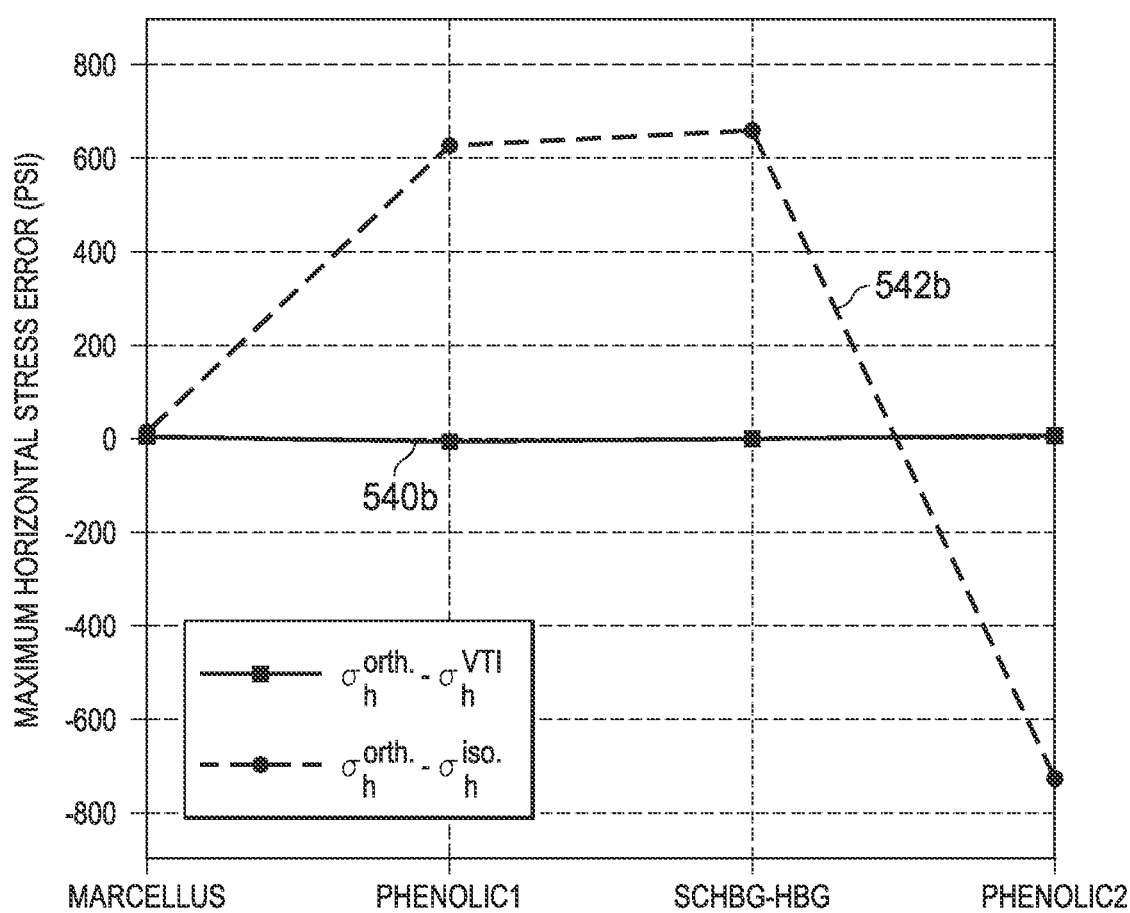

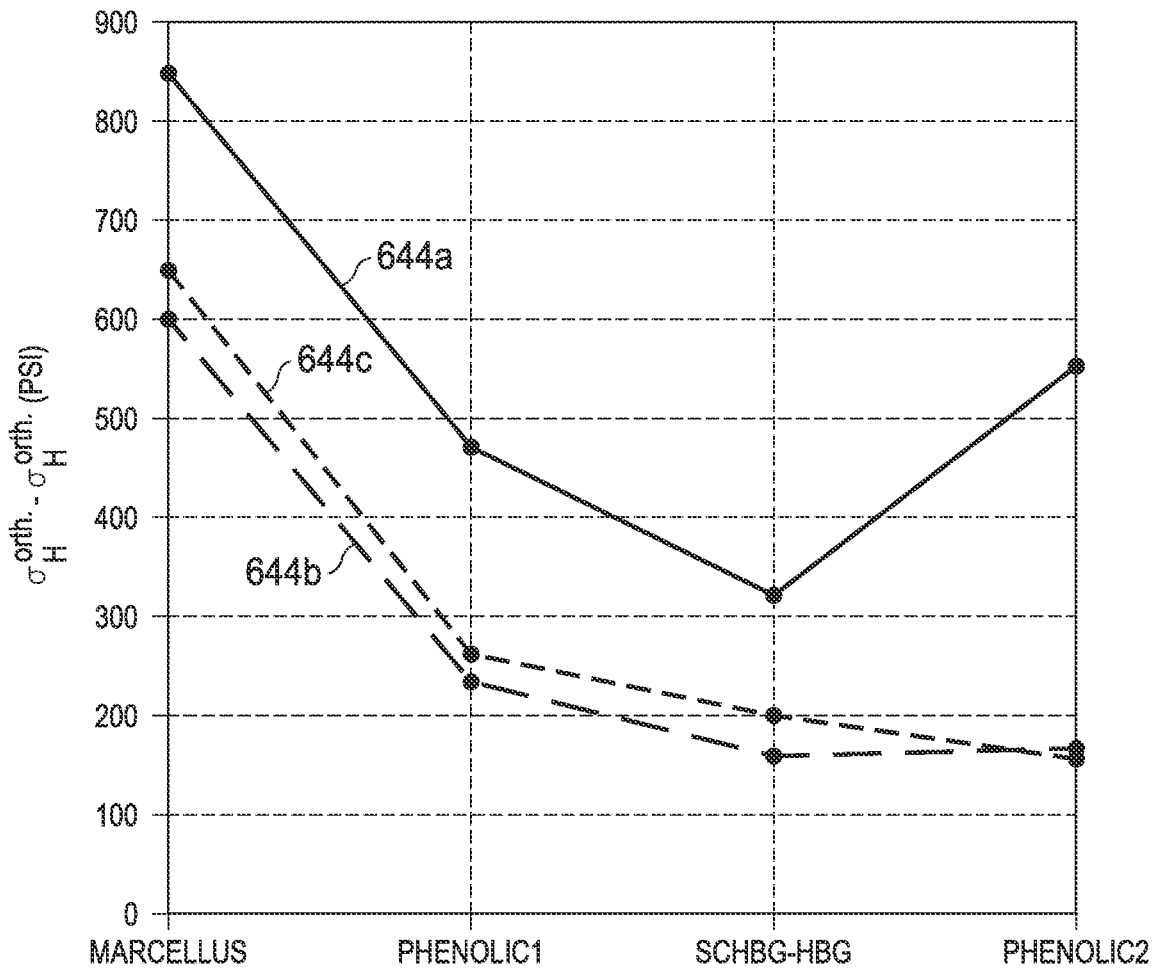

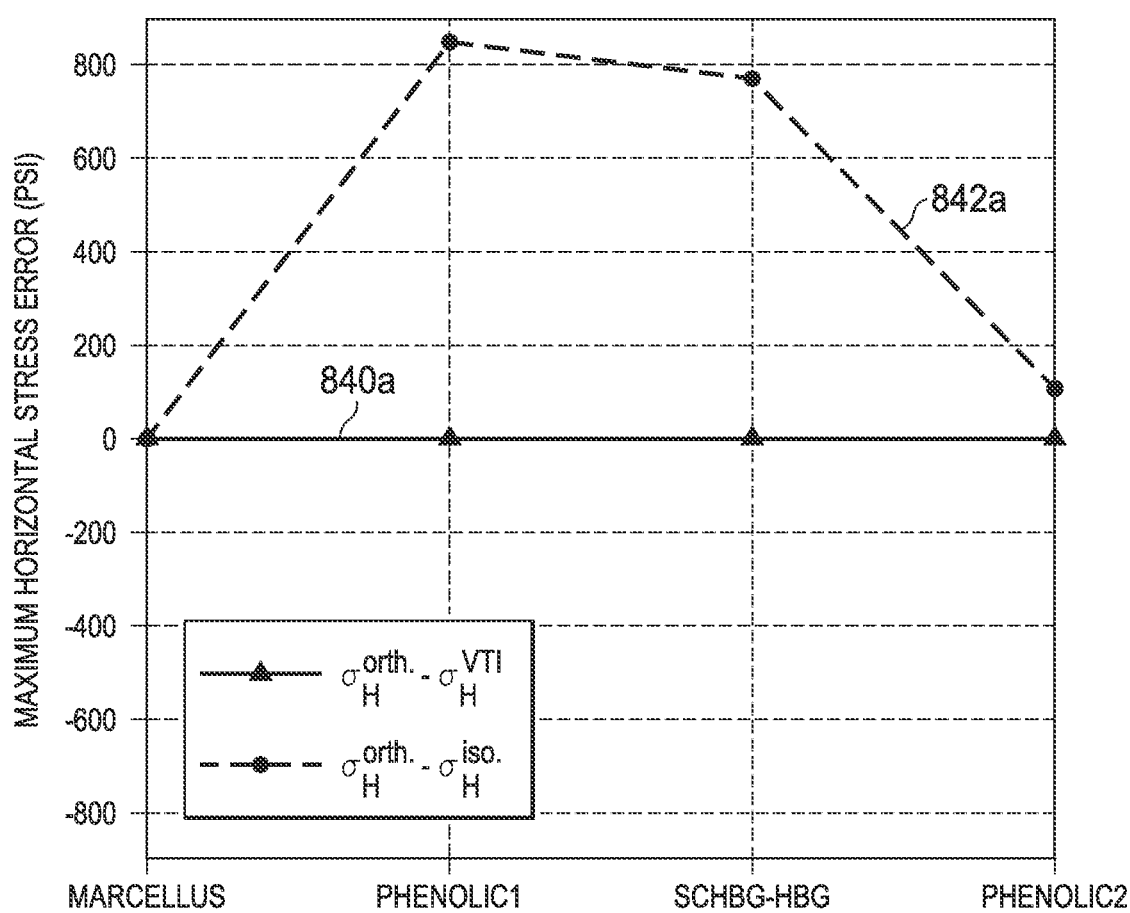

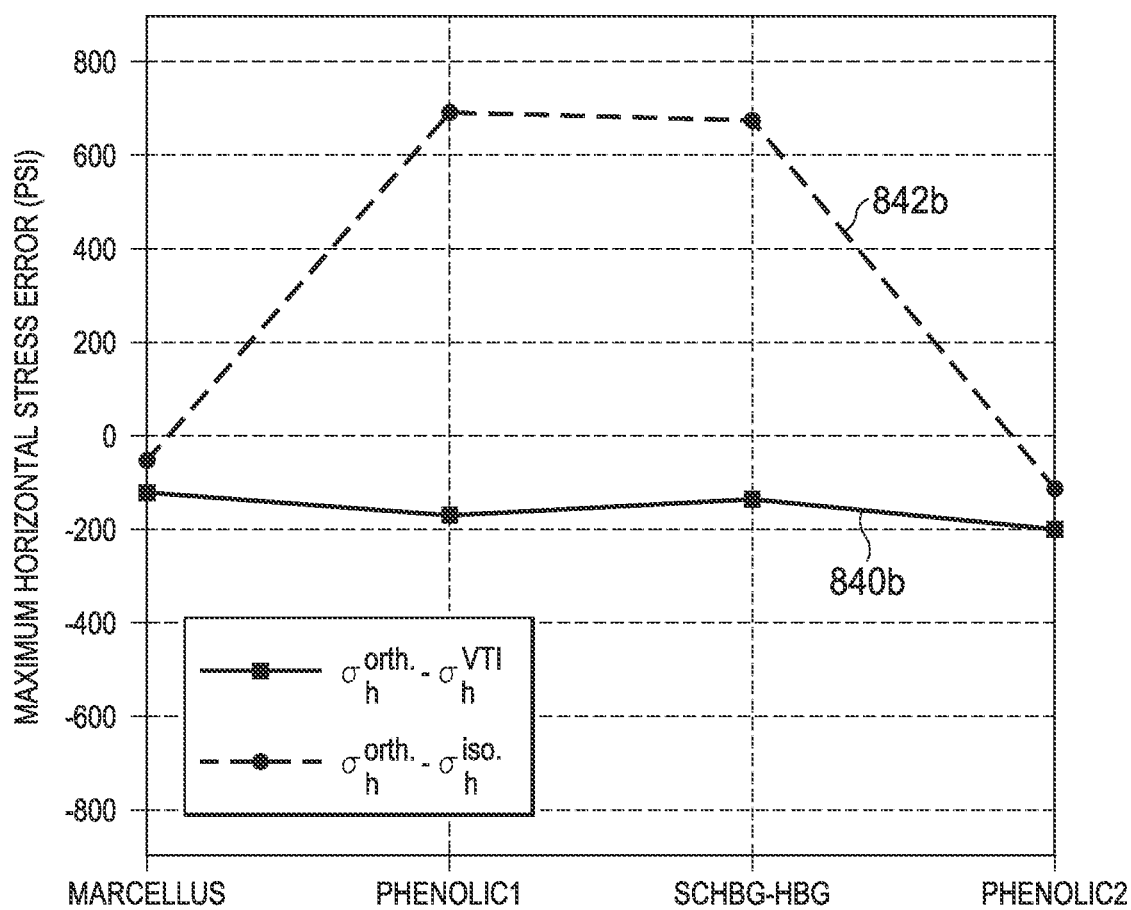

GEOMECHANICAL MODEL OF STRESSES ON AN ORTHORHOMBIC MEDIA

RELATED APPLICATIONS

This application is a U.S. National Stage Application of International Application No. PCT/US2014/070878 filed Dec. 17, 2014, which designates the United States, and which is incorporated herein by reference in its entirety.

TECHNICAL FIELD

The present disclosure relates generally to hydrocarbon recovery operations and, more particularly, to a geomechanical model of the stresses on an orthorhombic media for use during a subterranean operation.

BACKGROUND

Natural resources, such as hydrocarbons and water, are commonly obtained from subterranean formations that may be located onshore or offshore. The development of subterranean operations and the processes involved in removing natural resources from a subterranean formation typically involve a number of different steps such as, for example, drilling a wellbore at a desired well site, treating the wellbore to optimize production of natural resources, and performing the necessary steps to produce and process the natural resources from the subterranean formation.

While performing subterranean operations, it is often desirable to fracture the formation to enhance the production of natural resources. In a hydraulic fracturing operation, a pressurized fracturing fluid may be used to create and propagate a fracture within the formation.

BRIEF DESCRIPTION OF THE DRAWINGS

For a more complete understanding of the present disclosure and its features and advantages, reference is now made to the following description, taken in conjunction with the accompanying drawings, in which:

FIGS. 5A and 5B illustrate graphs of the errors in the maximum and minimum horizontal stresses, respectively, introduced during the use of simplified methods of calculating the stresses for the wellbore shown in FIG. 3;

FIG. 6 illustrates a graph of the stress anisotropy for the wellbore shown in FIG. 3, calculated with a geomechanical model, a VTI model, and an isotropic model;

FIGS. 8A and 8B illustrate graphs of the errors in the maximum and minimum horizontal stresses, respectively, introduced during the use of simplified methods of calculating the stresses for the wellbore shown in FIG. 7.

DETAILED DESCRIPTION

The present disclosure describes a geomechanical model of the stresses on an orthorhombic media for use during a subterranean operation. During the subterranean operation, pressurized fracturing fluid may be injected into a wellbore to create fractures in a subterranean formation in order to increase the rate of production of natural resources, such as oil and gas. Fractures in the formation may be created when the pressure of the fracturing fluid is greater than the fracture closure pressure of the subterranean formation. The fracture closure pressure may be calculated using a geomechanical model of the formation based on the properties of the formation. In some subterranean operations, the formation may be a horizontally laminated material, such as shale, and the geomechanical model may include consideration of the anisotropic (e.g., directional) properties of the formation and the presence of natural fractures in the formation. Accordingly, a system and method may be designed in accordance with the teachings of the present disclosure to create a geomechanical model of a horizontally laminated formation that includes pre-existing natural fractures. The geomechanical model can be used to calculate the fracture closure pressure and the pressure of the fracturing fluid, thus improving the efficiency of the subterranean operation. Embodiments of the present disclosure and their advantages are best understood by referring to FIGS. 1 through 9, where like numbers are used to indicate like and corresponding parts.

Figure 1:
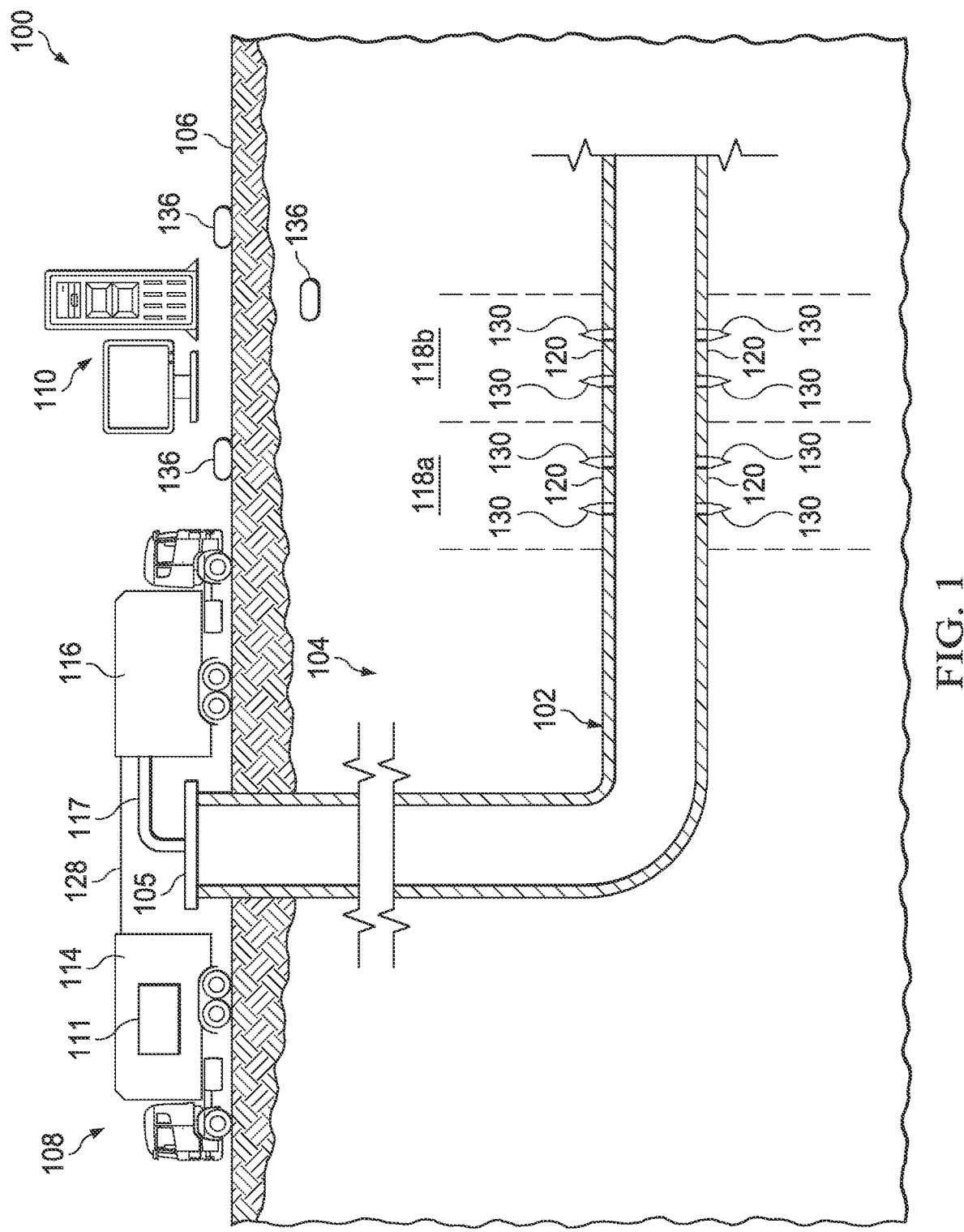
FIG. 1 illustrates an elevation view of an example embodiment of a subterranean operations system used in an illustrative wellbore environment.

FIG. 1 illustrates an elevation view of an example embodiment of a subterranean operations system used in an illustrative wellbore environment. Well system 100 may include wellbore 102 in subterranean region 104 beneath ground surface 106. Wellbore 102, as shown in FIG. 1, may include a horizontal wellbore. However, a well system may include any combination of horizontal, vertical, slant, curved, or other wellbore orientations. Well system 100 may include one or more additional treatment wells, observation wells, or other types of wells. Subterranean region 104 may include a reservoir that contains hydrocarbon resources, such as oil, natural gas, or others. For example, subterranean region 104 may include all or part of a rock formation (e.g., shale, coal, sandstone, granite, or others) that contains natural gas. Subterranean region 104 may include naturally fractured rock or natural rock formations that are not fractured to any significant degree. Subterranean region 104 may include tight gas formations of low permeability rock (e.g., shale, coal, or others).

Well system 100 may also include injection system 108. In some embodiments, injection system 108 may perform a treatment, for example, by injecting fluid into subterranean region 104 through wellbore 102. In some embodiments, a treatment fractures part of a rock formation or other materials in subterranean region 104. In such examples, fracturing a rock may increase the surface area of a formation, which may increase the rate at which the formation conducts hydrocarbon resources to wellbore 102.

Injection system 108 may be used to perform one or more treatments including, for example, injection treatments or flow back treatments. For example, injection system 108 may apply treatments including single-stage injection treatments, multi-stage injection treatments, mini-fracture test treatments, follow-on fracture treatments, re-fracture treatments, final fracture treatments, other types of fracture treatments, or any suitable combination of treatments. An injection treatment may be, for example, a multi-stage injection treatment where an individual injection treatment is performed during each stage. A treatment may be applied at a single fluid injection location or at multiple fluid injection locations in a subterranean region, and fluid may be injected over a single time period or over multiple different time periods. In some instances, a treatment may use multiple different fluid injection locations in a single wellbore, multiple fluid injection locations in multiple different wellbores, or any suitable combination. Moreover, a treatment may inject fluid through any suitable type of wellbore, such as, for example, vertical wellbores, slant wellbores, horizontal wellbores, curved wellbores, or any suitable combination of these and others.

Injection system 108 may inject treatment fluid into subterranean region 104 through wellbore 102. Injection system 108 may include instrument truck 114, pump truck 116, and injection treatment control subsystem 111. Injection system 108 may include other features not shown in the figures. Although FIG. 1 depicts a single instrument truck 114 and a single pump truck 116, any suitable number of instrument trucks 114 and pump trucks 116 may be used.

Pump trucks 116 may communicate treatment fluids into wellbore 102, for example, through conduit 117, at or near the level of ground surface 106. Pump trucks 116 may include mobile vehicles, immobile installations, skids, hoses, tubes, fluid tanks, fluid reservoirs, pumps, valves, mixers, or other types of structures and equipment. Pump trucks 116 may supply treatment fluid or other materials for a treatment. Pump trucks 116 may contain multiple different treatment fluids, proppant materials, or other materials for different stages of a treatment. Treatment fluids may be communicated through wellbore 102 from ground surface 106 level by a conduit installed in wellbore 102. The conduit may include casing cemented to the wall of wellbore 102. In some embodiments, all or a portion of wellbore 102 may be left open, without casing. The conduit may include a working string, coiled tubing, sectioned pipe, or other types of conduit.

Instrument trucks 114 may include injection treatment control subsystem 111, which controls or monitors the treatment applied by injection system 108. Instrument trucks 114 may include mobile vehicles, immobile installations, or other suitable structures. Injection treatment control subsystem 111 may control operation of injection system 108. Injection treatment control subsystem 111 may include data processing equipment, communication equipment, or other systems that control stimulation treatments applied to subterranean region 104 through wellbore 102. Injection treatment control subsystem 111 may include or be communicatively coupled to a computing system (e.g., computing subsystem 110) that calculates, selects, or optimizes treatment parameters for initialization, propagation, or opening fractures in subterranean region 104. Injection treatment control subsystem 111 may receive, generate or modify a stimulation treatment plan (e.g., a pumping schedule) that specifies properties of a treatment to be applied to subterranean region 104.

Injection system 108 may use multiple treatment stages or intervals, such as stage 118a and stage 118b (collectively "stages 118"). Injection system 108 may delineate fewer stages or multiple additional stages beyond the two exemplary stages 118 shown in FIG. 1. Stages 118 may each have one or more perforation clusters 120 that include one or more perforations. Fractures in subterranean region 104 may be initiated at or near perforation clusters 120 or elsewhere. Stages 118 may have different widths or may be uniformly distributed along wellbore 102. Stages 118 may be distinct, nonoverlapping (or overlapping) injection zones along wellbore 102. In some embodiments, each stage 118 may be isolated from other stages 118, for example, by packers or other types of seals in wellbore 102. In some embodiments, each stage 118 may be treated individually, for example, in series along wellbore 102. Injection system 108 may perform identical, similar, or different injection treatments at different stages 118.

A treatment, as well as other activities and natural phenomena, may generate microseismic events in subterranean region 104. For example, injection system 108 may cause multiple microseismic events 132 during a multi-stage injection treatment. Microseismic data may be collected from subterranean region 104. Microseismic data detected in well system 100 may include acoustic signals generated by natural phenomena, acoustic signals associated with a stimulation treatment applied through wellbore 102, or other types of signals. For instance, sensors 136 may detect acoustic signals generated by rock slips, rock movements, rock fractures or other events in subterranean region 104. Microseismic events in subterranean region 104 may occur, for example, along or near induced hydraulic fractures. The microseismic events may be associated with pre-existing natural fractures or hydraulic fracture planes induced by fracturing activities. Microseismic data from a stimulation treatment may include information collected before, during, or after fluid injection.

Wellbore 102 may include sensors 136, microseismic array, and other equipment that may be used to detect microseismic data. Sensors 136 may include geophones or other types of listening equipment. Sensors 136 may be located at a variety of positions in well system 100. As shown in FIG. 1, sensors 136 may be installed at surface 106 and beneath surface 106 (e.g., in an observation well (not shown)). Additionally or alternatively, sensors 136 may be positioned in other locations above or below ground surface 106, in other locations within wellbore 102, or within another wellbore (e.g., another treatment well or an observation well). Wellbore 102 may include additional equipment (e.g., working string, packers, casing, or other equipment) not shown in FIG. 1.

Sensors 136 or other detecting equipment in well system 100 may detect the microseismic events, and collect and transmit the microseismic data, for example, to computing subsystem 110. Computing subsystem 110 may be located above ground surface 106. Computing subsystem 110 may include one or more computing devices or systems located at the wellbore 102, or in other locations. Computing subsystem 110 or any of its components may be located apart from the other components shown in FIG. 1. For example, computing subsystem 110 may be located at a data processing center, a computing facility, or another suitable location. In some cases, all or part of computing subsystem 110 may be contained in a technical command center at a well site, in a real-time operations center at a remote location, in another appropriate location, or any suitable combination of these.

Well system 100 and computing subsystem 110 may include or access any suitable communication infrastructure. Communication links 128 may allow instrument trucks 114 to communicate with pump trucks 116, or other equipment at ground surface 106. Additional communication links may allow instrument trucks 114 to communicate with sensors or data collection apparatus in well system 100, remote systems, other well systems, equipment installed in wellbore 102 or other devices and equipment. For example, well system 100 may include multiple separate communication links or a network of interconnected communication links. These communication links may include wired or wireless communications systems. For example, sensors 136 may communicate with instrument trucks 114 or computing subsystem 110 through wired or wireless links or networks, or instrument trucks 114 may communicate with computing subsystem 110 through wired or wireless links or networks. These communication links may include a public data network, a private data network, satellite links, dedicated communication channels, telecommunication links, or any suitable combination of these and other communication links.

In some embodiments, formation 104 may be a horizontally laminated, or layered, media, such as shale. The lamination of formation 104 may introduce directional dependency into the physical properties of formation 104. A horizontally laminated media which includes one or two sets of vertical and orthogonal natural fractures may be modeled as an orthorhombic media where the mechanical properties of the media may be directionally dependent. In some embodiments, formation 104 may include natural fractures that run vertically through formation 104. The natural fractures may include one or two sets of vertical fractures where one set of natural fractures may be orthogonal, or at right angles, to the other set of natural fractures.

Formation 104 may include natural fractures that may be created by stresses in formation 104. The stresses in formation 104 may be due to plate tectonics and may create unequal stresses in different directions (e.g., stress anisotropy). The horizontal stresses may create vertical natural fractures. During a subterranean operation, formation 104 may be fractured to increase the production of natural resources (e.g., oil, and/or gas) from formation 104. A high-pressure fracturing fluid may be pumped downhole through any suitable tubing in wellbore 102 and used to create fractures 130. The stresses in formation 104 caused by the natural fractures may act to force fractures 130 to collapse or close. This stress may be referred to as the "fracture closure pressure." Therefore, to create fracture 130, the pressure of the fracturing fluid may be selected based on the stresses in formation 104 such that the pressure of the fracturing fluid is higher than the closure pressure of formation 104. A geomechanical model of the stresses in formation 104 may be used to determine the fracture closure pressure of formation 104 which may be used to select a pressure for the fracturing fluid. As such, a geomechanical model designed according to the present disclosure may increase the efficiency and effectiveness of a subterranean operation, as discussed in further detail with respect to FIGS. 2-9.

Well system 100 may include additional or different features, and the features of well system 100 may be arranged as shown in FIG. 1, or in another suitable configuration. Some of the techniques and operations described here may be implemented by a computing subsystem configured to provide the functionality described. In various embodiments, a computing system may include any of various types of devices, including, but not limited to, personal computer systems, desktop computers, laptops, notebooks, mainframe computer systems, handheld computers, workstations, tablets, application servers, storage devices, computing clusters, or any type of computing or electronic device.

Figure 2:
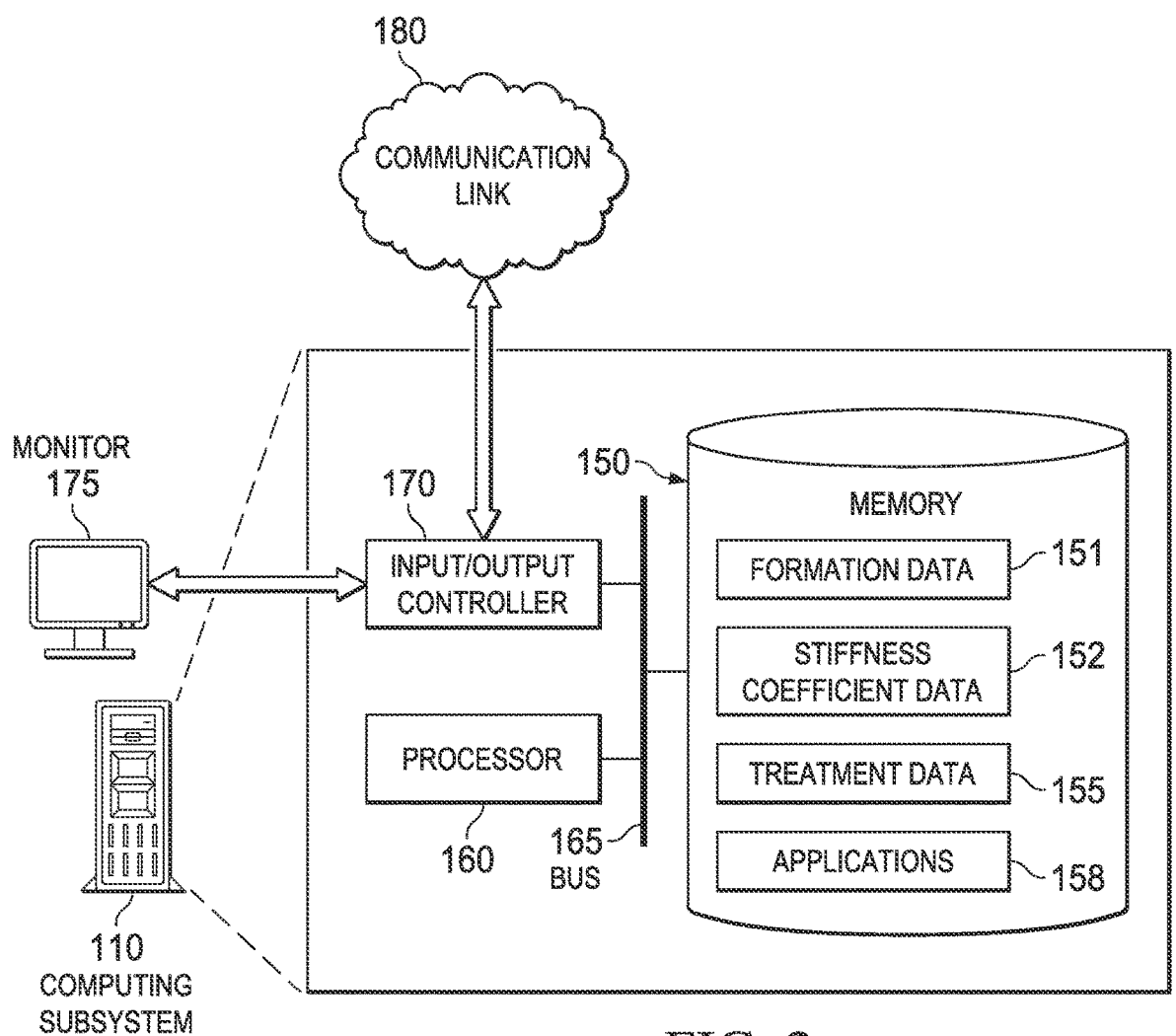
FIG. 2 an exemplary computing subsystem shown in FIG. 1.

FIG. 2 illustrates an exemplary computing subsystem 110 of FIG. 1. Computing subsystem 110 may be located at or near one or more wellbores of well system 100 or at a remote location. All or part of computing subsystem 110 may operate as a component of or independent of well system 100 or independent of any other components shown in FIG. 1. Computing subsystem 110 may include memory 150, processor 160, and input/output controllers 170 communicatively coupled by bus 165.

Processor 160 may include hardware for executing instructions, such as those making up a computer program, such as application 158. As an example and not by way of limitation, to execute instructions, processor 160 may retrieve (or fetch) the instructions from an internal register, an internal cache, memory 150; decode and execute them; and then write one or more results to an internal register, an internal cache, memory 150. This disclosure contemplates processor 160 including any suitable number of any suitable internal registers, where appropriate. Where appropriate, processor 160 may include one or more arithmetic logic units (ALUs); be a multi-core processor; or include one or more processors 160. Although this disclosure describes and illustrates a particular processor, this disclosure contemplates any suitable processor.

In some embodiments, processor 160 may execute instructions, for example, to generate output data based on data inputs. For example, processor 160 may run application 158 by executing or interpreting software, scripts, programs, functions, executables, or other modules contained in application 158. Processor 160 may perform one or more operations related to FIGS. 2-8. Input data received by processor 160 or output data generated by processor 160 may include formation data 151 and stiffness coefficient data 152.

Memory 150 may include, for example, random access memory (RAM), a storage device (e.g., a writable read-only memory (ROM) or others), a hard disk, a solid state storage device, or another type of storage medium. Computing subsystem 110 may be preprogrammed or it may be programmed (and reprogrammed) by loading a program from another source (e.g., from a CD-ROM, from another computer device through a data network, or in another manner). In some embodiments, input/output controller 170 may be coupled to input/output devices (e.g., monitor 175, a mouse, a keyboard, or other input/output devices) and to communication link 180. The input/output devices may receive and transmit data in analog or digital form over communication link 180.

Memory 150 may store instructions (e.g., computer code) associated with an operating system, computer applications, and other resources. Memory 150 may also store application data and data objects that may be interpreted by one or more applications or virtual machines running on computing subsystem 110. For example, formation data 151, stiffness coefficient data 152, and applications 158 may be stored in memory 150. In some implementations, a memory of a computing device may include additional or different data, applications, models, or other information.

Formation data 151 may include information that may be used to determine the properties of the formation (e.g., the pore pressure, the Biot coefficient, the vertical stress, and the horizontal stresses). Stiffness coefficient data 152 may include information that may provide a pre-determined set of stiffness coefficients for a formation. Stiffness coefficient data 152 may specify any suitable stiffness coefficient matrix that may be used for calculating the mechanical properties of a formation, such as the minimum and maximum stresses, the Poisson's ratios, and the Young's moduli.

Treatment data 155 may include information on properties of a planned treatment of subterranean region 104. In some embodiments, treatment data 155 may include information on a pumping schedule for a treatment stage, such as fluid volume, fluid pumping rate, or fluid pumping pressure.

Applications 158 may include software applications, scripts, programs, functions, executables, or other modules that may be interpreted or executed by processor 160. The applications 158 may include machine-readable instructions for performing one or more operations related to FIGS. 3-8. Applications 158 may include machine-readable instructions for calculating the minimum and maximum horizontal stresses, Poisson's ratios, and Young's moduli of a formation and may be used for any suitable subterranean operation. For example, applications 158 may be configured to calculate the mechanical properties of a formation and determine the pressure of the fracturing fluid used during a subterranean operation. Applications 158 may generate output data and store output data in memory 150, in another local medium, or in one or more remote devices (e.g., by sending output data via communication link 180).

Communication link 180 may include any type of communication channel, connector, data communication network, or other link. For example, communication link 180 may include a wireless or a wired network, a Local Area Network (LAN), a Wide Area Network (WAN), a private network, a public network (such as the Internet), a WiFi network, a network that includes a satellite link, a serial link, a wireless link (e.g., infrared, radio frequency, or others), a parallel link, or another type of data communication network.

Figure 3:
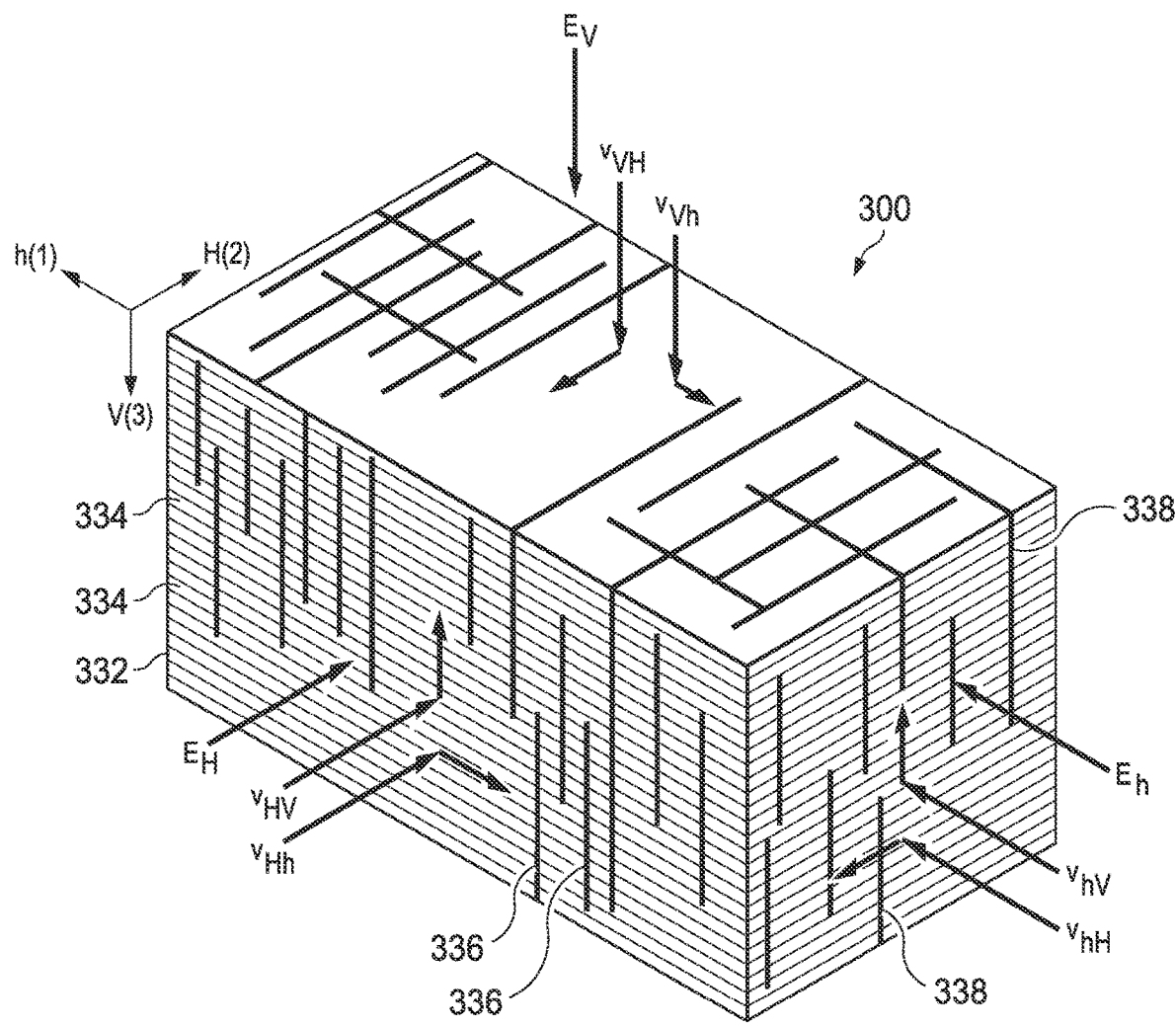
FIG. 3 illustrates a isometric view of a section of a horizontally laminated formation including two sets of vertical fractures and the associated directional Poisson's ratios and Young's moduli of the formation.

Generally, the techniques described here may be performed at any time, for example, before, during, or after a treatment or other event. In some instances, the techniques described may be implemented in real time, for example, during a stimulation treatment. Additionally computing subsystem 110 may be located on the surface of the wellbore or may be located downhole as part of a downhole tool or injection system. FIG. 3 illustrates an isometric view of a section of a horizontally laminated formation including two sets of vertical fractures and the associated directional Poisson's ratios and Young's moduli of the formation. Formation 332 includes horizontally laminated layers 334 and two sets of vertical natural fractures 336 and 338. Fractures 336 may be orthogonal to fractures 338. Where formation 332 has more than one set of fractures 336 and 338, one set may be said to be the dominant set and may be aligned with the maximum horizontal stress, $\sigma_H$, in formation 332. In FIG. 3, fractures 336 are the dominant set of fractures. The coordinate system in FIG. 3 is established to align with the fractures and the H-axis is aligned with the dominant fractures (e.g., fractures 336). The h-axis is aligned with the direction of minimum horizontal stress, $\sigma_h$, which may coincide with fractures 338. Vertical fractures 336 and 338 may imply that the vertical stress, $\sigma_V$, is the first principal stress. The V-axis is aligned with the vertical direction.

For linear elastic materials such as horizontally laminated formations, the stress, $\sigma_{ij}$, in a direction is linearly proportional to the strain, $\varepsilon_{ij}$, in the same direction according to Hooke's Law. The proportional relationship between the stress and the strain may be governed by a fourth-rank stiffness tensor, $C_{ijkl}$, or a fourth-rank compliance tensor, $S_{ijkl}$, according to the following equations:

$$\sigma_{ij} = C_{ijkl} \varepsilon_{kl} \quad (1)$$

$$\varepsilon_{ij} = S_{ijkl} \sigma_{kl} \quad (2)$$

The Poisson's ratios, $v_{ij}$, and the Young's moduli, $E_i$, in each direction of formation 332 may be defined based on the stress and strain in the directions. In FIG. 3, the Poisson's ratios are shown as two arrows, illustrating the direction of the applied stress and the direction of the strain due to the applied stress. For example, $v_{Hv}$ is the Poisson's ratio due to the stress applied in the H direction and is defined as the ratio of strain in the V direction to the strain in the H direction. The Young's moduli are represented by a single arrow in FIG. 3 and are oriented in the direction of the applied stress. The Poisson's ratios and Young's moduli for each direction may be calculated by:

$$v_{VH} = -\frac{\varepsilon_H}{\varepsilon_V} \quad (3)$$

$$v_{Vh} = -\frac{\varepsilon_h}{\varepsilon_V} \quad (4)$$

$$v_{hV} = -\frac{\varepsilon_V}{\varepsilon_h} \quad (5)$$

$$v_{hH} = -\frac{\varepsilon_H}{\varepsilon_h} \quad (6)$$

$$v_{HV} = -\frac{\varepsilon_V}{\varepsilon_H} \quad (7)$$

$$v_{Hh} = -\frac{\varepsilon_h}{\varepsilon_H} \quad (8)$$

$$E_V = \frac{\sigma_V}{\varepsilon_V} \quad (9)$$

$$E_h = \frac{\sigma_h}{\varepsilon_h} \quad (10)$$

$$E_H = \frac{\sigma_H}{\varepsilon_H} \quad (11)$$

The stiffness tensor of a formation may determine the elastic properties of the formation. For horizontally laminated formations with one or two sets of orthogonal vertical fractures, the stiffness tensor may be defined using nine independent parameters using the equation:

$$C = \begin{bmatrix} C_{11} & C_{12} & C_{13} & 0 & 0 & 0 \\ C_{12} & C_{22} & C_{23} & 0 & 0 & 0 \\ C_{13} & C_{23} & C_{33} & 0 & 0 & 0 \\ 0 & 0 & 0 & C_{44} & 0 & 0 \\ 0 & 0 & 0 & 0 & C_{55} & 0 \\ 0 & 0 & 0 & 0 & 0 & C_{66} \end{bmatrix} \quad (12)$$

The compliance tensor may also be defined using nine independent parameters related to the Poisson's ratios and Young's moduli using the equation:

$$S = \begin{bmatrix} \frac{1}{E_1} & -\frac{v_{21}}{E_2} & -\frac{v_{31}}{E_3} & 0 & 0 & 0 \\ -\frac{v_{12}}{E_1} & \frac{1}{E_2} & -\frac{v_{32}}{E_3} & 0 & 0 & 0 \\ -\frac{v_{13}}{E_1} & -\frac{v_{23}}{E_2} & \frac{1}{E_3} & 0 & 0 & 0 \\ 0 & 0 & 0 & \frac{1}{2\mu_{23}} & 0 & 0 \\ 0 & 0 & 0 & 0 & \frac{1}{2\mu_{31}} & 0 \\ 0 & 0 & 0 & 0 & 0 & \frac{1}{2\mu_{12}} \end{bmatrix} \quad (13)$$

Based on the compliance tensor matrix in Equation 13, Equation 2 may be rewritten as:

$$\begin{bmatrix} \varepsilon_{11} \\ \varepsilon_{22} \\ \varepsilon_{33} \\ \varepsilon_{23} \\ \varepsilon_{31} \\ \varepsilon_{12} \end{bmatrix} = \begin{bmatrix} \frac{1}{E_1} & -\frac{v_{21}}{E_2} & -\frac{v_{31}}{E_3} & 0 & 0 & 0 \\ -\frac{v_{12}}{E_1} & \frac{1}{E_2} & -\frac{v_{32}}{E_3} & 0 & 0 & 0 \\ -\frac{v_{13}}{E_1} & -\frac{v_{23}}{E_2} & \frac{1}{E_3} & 0 & 0 & 0 \\ 0 & 0 & 0 & \frac{1}{2\mu_{23}} & 0 & 0 \\ 0 & 0 & 0 & 0 & \frac{1}{2\mu_{31}} & 0 \\ 0 & 0 & 0 & 0 & 0 & \frac{1}{2\mu_{12}} \end{bmatrix} \begin{bmatrix} \sigma_{11} \\ \sigma_{22} \\ \sigma_{33} \\ \sigma_{23} \\ \sigma_{31} \\ \sigma_{12} \end{bmatrix} \quad (14)$$

Due to the symmetry of the compliance matrix shown in Equation 14, the following equations apply:

$$\frac{E_i}{E_j} = \frac{v_{ij}}{v_{ji}} \quad (15)$$

$$\frac{\left(\frac{E_i}{E_j}\right)^{1/2}}{|v_{ij}|} > 1 \quad (16)$$

Using Equation 2, the Poisson's ratios and Young's moduli may be defined in terms of the compliance tensor by:

$$E_i = \frac{\sigma_i}{\varepsilon_i} = \frac{1}{s_{ii}} \quad (17)$$

$$v_{ij} = -\frac{\varepsilon_j}{\varepsilon_i} = \frac{s_{ji}}{s_{ii}} \quad (18)$$

Assuming there is no summation over repeated indices, Equations 17 and 18 may be rewritten with reference to the axes shown in FIG. 3 according to the following equivalencies:

$1 \leftrightarrow h \; 2 \leftrightarrow H \; 3 \leftrightarrow V$
$\varepsilon_{11} \rightarrow \varepsilon_h \; \varepsilon_{22} \rightarrow \varepsilon_H$
$\sigma_{11} \rightarrow \sigma_h \; \sigma_{22} \rightarrow \sigma_H$
$E_1 \rightarrow E_h \; E_2 \rightarrow E\varepsilon_H \; E_3 \rightarrow E_V$
$v_{12} \rightarrow v_{hH} \; v_{21} \rightarrow v_{Hh} \; v_{13} \rightarrow v_{hV}$
$v_{31} \rightarrow v_{Vh} \; v_{23} \rightarrow v_{HV} \; v_{32} \rightarrow v_{VH}$ Table 1: Conversion between arbitrary notation to geomechanical notation In geomechanical applications, the use of the stiffness tensor may be more convenient than the use of the compliance tensor as data about the stiffness tensor parameters may be available from testing and/or modeling of formation 332. Equations 17 and 18 may be used to create equations for the Poisson's ratios and Young's moduli in each direction. The resulting equations are:

$$v_{12} = v_{hH} = -\frac{C_{13}C_{23} - C_{12}C_{33}}{C_{22}C_{33} - C_{23}^2} \quad (19)$$

$$v_{21} = v_{Hh} = -\frac{C_{13}C_{23} - C_{12}C_{33}}{C_{11}C_{33} - C_{13}^2} \quad (20)$$

$$v_{13} = v_{hV} = -\frac{C_{12}C_{23} - C_{13}C_{22}}{C_{22}C_{33} - C_{23}^2} \quad (21)$$

$$v_{31} = v_{Vh} = -\frac{C_{12}C_{23} - C_{13}C_{22}}{C_{11}C_{22} - C_{12}^2} \quad (22)$$

$$v_{23} = v_{HV} = -\frac{C_{12}C_{13} - C_{11}C_{23}}{C_{11}C_{33} - C_{13}^2} \quad (23)$$

$$v_{32} = v_{VH} = -\frac{C_{12}C_{13} - C_{11}C_{23}}{C_{11}C_{22} - C_{12}^2} \quad (24)$$

$$E_1 = E_h = -\frac{C_{11}C_{23}^2 + C_{22}C_{13}^2 + C_{33}C_{12}^2 - 2C_{12}C_{13}C_{23} - C_{11}C_{22}C_{33}}{C_{22}C_{33} - C_{23}^2} \quad (25)$$

$$E_2 = E_H = -\frac{C_{11}C_{23}^2 + C_{22}C_{13}^2 + C_{33}C_{12}^2 - 2C_{12}C_{13}C_{23} - C_{11}C_{22}C_{33}}{C_{11}C_{33} - C_{13}^2} \quad (26)$$

$$E_3 = E_V = -\frac{C_{11}C_{23}^2 + C_{22}C_{13}^2 + C_{33}C_{12}^2 - 2C_{12}C_{13}C_{23} - C_{11}C_{22}C_{33}}{C_{11}C_{22} - C_{12}^2} \quad (27)$$

The minimum and maximum horizontal stresses, aligned in the h-direction and H-direction, respectively, may be derived from Hooke's law for orthorhombic media, as shown in Equation 14 and may be converted into the notation system convenient for geomechanical applications, as shown by Table 1. Hooke's law for orthorhombic media may be expressed as a system of linear equations. Therefore the equations for the minimum horizontal stress, $\varepsilon_h$, and the maximum horizontal stress, $\varepsilon_H$, may be calculated as:

$$\varepsilon_h = \frac{1}{E_h}\sigma_h - \frac{v_{Hh}}{E_H}\sigma_H - \frac{v_{Vh}}{E_V}\sigma_V \quad (28)$$

$$\varepsilon_H = \frac{1}{E_H}\sigma_H - \frac{v_{hH}}{E_h}\sigma_h - \frac{v_{VH}}{E_V}\sigma_V \quad (29)$$

The stress in the H-direction may be calculated by substituting $\sigma_h$ in Equation 29 into Equation 28 and may be calculated by:

$$\sigma_H = \frac{E_H}{E_V}\left(\frac{v_{VH} + v_{Vh}v_{hH}}{1 - v_{Hh}v_{hH}}\right)\sigma_V + \frac{E_H}{1 - v_{Hh}v_{hH}}\varepsilon_H + \frac{E_H v_{hH}}{1 - v_{Hh}v_{hH}}\varepsilon_h \quad (30)$$

The stress in the h-direction may be calculated by substituting $\sigma_H$ in Equation 29 into Equation 28 and may be calculated by:

$$\sigma_h = \frac{E_h}{E_V}\left(\frac{v_{Vh} + v_{VH}v_{Hh}}{1 - v_{Hh}v_{hH}}\right)\sigma_V + \frac{E_h}{1 - v_{Hh}v_{hH}}\varepsilon_h + \frac{E_h v_{Hh}}{1 - v_{Hh}v_{hH}}\varepsilon_H \quad (31)$$

Using Equation 15, Equations 30 and 31 may be rewritten as:

$$\sigma_H = \frac{v_{HV}}{v_{VH}}\left(\frac{v_{VH} + v_{Vh}v_{hH}}{1 - v_{Hh}v_{hH}}\right)\sigma_V + \frac{E_H}{1 - v_{Hh}v_{hH}}\varepsilon_H + \frac{E_H v_{hH}}{1 - v_{Hh}v_{hH}}\varepsilon_h \quad (32)$$

$$\sigma_h = \frac{v_{hV}}{v_{Vh}}\left(\frac{v_{Vh} + v_{VH}v_{Hh}}{1 - v_{Hh}v_{hH}}\right)\sigma_V + \frac{E_h}{1 - v_{Hh}v_{hH}}\varepsilon_h + \frac{E_h v_{Hh}}{1 - v_{Hh}v_{hH}}\varepsilon_H \quad (33)$$

While $v_{Hh}$ and $v_{hH}$ are numbers smaller than one and, in some cases, the product of $v_{Hh}$ and $v_{hH}$ may be assumed to be equal to zero, numerical modeling results show that it is not a valid approximation for anisotropic models. Therefore Equations 32 and 33 may not be simplified based on the assumption. In geomechanics, the effect of the pore pressure in formation 332 may be also considered when creating a model. The pore pressure is the pressure of fluids located within the pores of formation 332. Considering the effects of the pore pressure in formation 332, Equations 32 and 33 become:

$$\sigma_H = \frac{E_H}{E_V}\left(\frac{v_{VH} + v_{Vh}v_{hH}}{1 - v_{Hh}v_{hH}}\right)(\sigma_V - \alpha P) + \quad (34)$$
$$\frac{E_H}{1 - v_{Hh}v_{hH}}\varepsilon_H + \frac{E_H v_{hH}}{1 - v_{Hh}v_{hH}}\varepsilon_h + \alpha P$$

$$\sigma_h = \frac{E_h}{E_V}\left(\frac{v_{Vh} + v_{VH}v_{Hh}}{1 - v_{Hh}v_{hH}}\right)(\sigma_V - \alpha P) + \quad (35)$$
$$\frac{E_h}{1 - v_{Hh}v_{hH}}\varepsilon_h + \frac{E_h v_{Hh}}{1 - v_{Hh}v_{hH}}\varepsilon_H + \alpha P$$

$$\sigma_H = \frac{v_{HV}}{v_{VH}}\left(\frac{v_{VH} + v_{Vh}v_{hH}}{1 - v_{Hh}v_{hH}}\right)(\sigma_V - \alpha P) + \quad (36)$$
$$\frac{E_H}{1 - v_{Hh}v_{hH}}\varepsilon_H + \frac{E_H v_{hH}}{1 - v_{Hh}v_{hH}}\varepsilon_h + \alpha P$$

$$\sigma_h = \frac{v_{hV}}{v_{Vh}}\left(\frac{v_{Vh} + v_{VH}v_{Hh}}{1 - v_{Hh}v_{hH}}\right)(\sigma_V - \alpha P) + \quad (37)$$
$$\frac{E_h}{1 - v_{Hh}v_{hH}}\varepsilon_h + \frac{E_h v_{Hh}}{1 - v_{Hh}v_{hH}}\varepsilon_H + \alpha P$$

where P is the pore pressure and α is the Biot coefficient. The Biot coefficient is a function of the properties of formation 332. While in Equations 34-37 the Biot coefficient is assumed to be isotropic and a constant number, the Biot coefficient may also be anisotropic and represented as a matrix and may vary during the subterranean operation. Equations 34-37 may be used to determine the fracture closure pressure of formation 332. The fracture closure pressure may then be used to select the pressure of the fracturing fluid such that the pressure of the fracturing fluid is higher than the fracture closure pressure.

Figure 4:
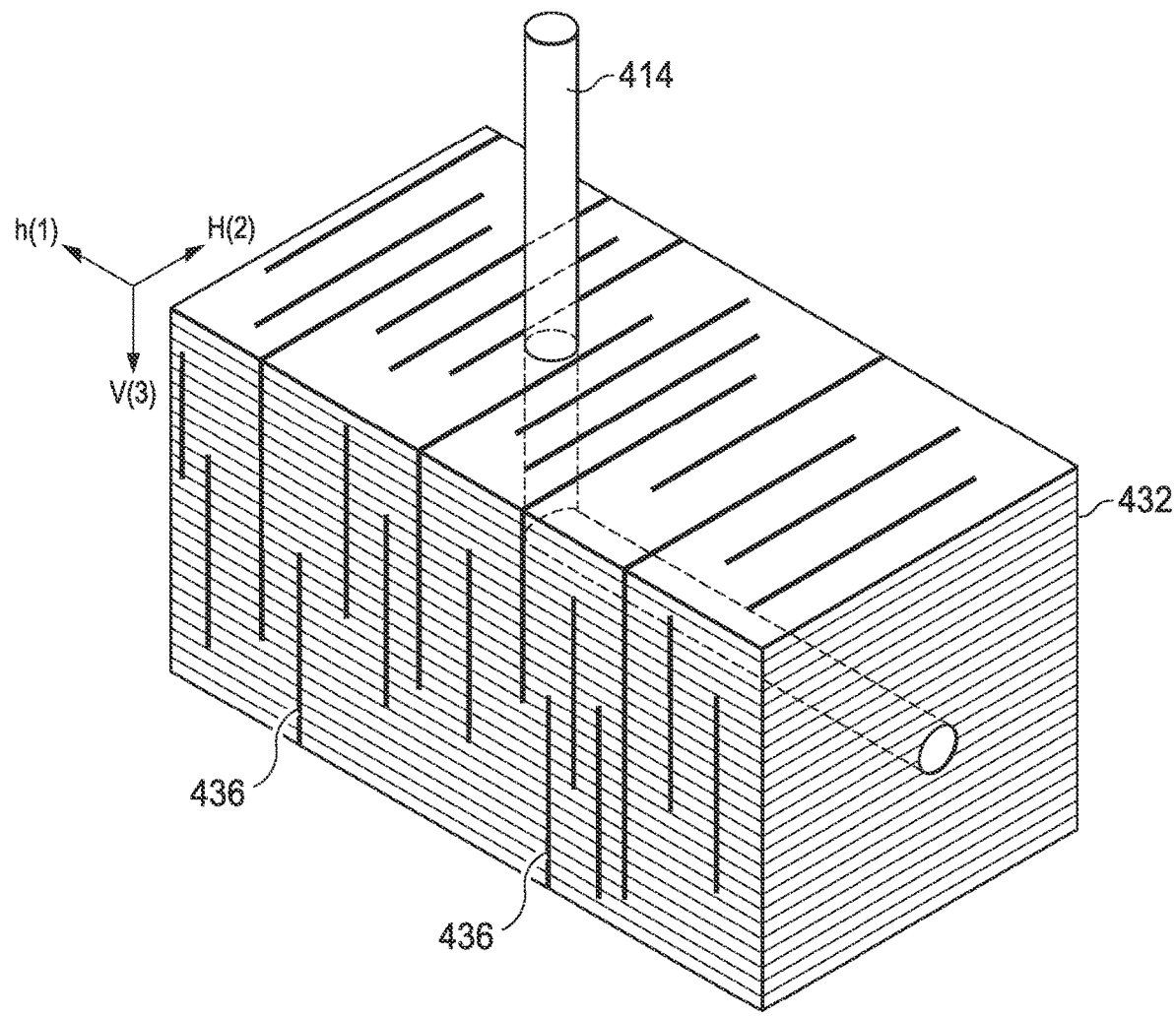
FIG. 4 illustrates an isometric view of an exemplary subterranean operation with a horizontal well drilled perpendicular to the dominant fractures in the formation.

An accurate estimation of the stresses in formation 332 may be important when designing a subterranean operation. FIG. 4 illustrates an isometric view of an exemplary subterranean operation with a horizontal well drilled perpendicular to the dominant fractures in the formation. Wellbore 414 may be drilled vertically to a predetermined depth and then drilled horizontally through formation 432 in a direction perpendicular to dominant fractures 436. The coordinate system shown in FIG. 4 is oriented such that the H-direction corresponds to the direction of dominant fractures 436. Because wellbore 414 is drilled perpendicular to dominant fractures 436, it may also be parallel to the direction of the minimum horizontal stress, $\sigma_h$. FIG. 4 may represent the optimal direction for wellbore 414 as fractures may be easier to open when wellbore 414 is perpendicular to dominant fractures 436.

The stresses calculated by the disclosed geomechanical model where both fractures 436 and the anisotropic nature of formation 432 are considered may be compared with a model that only considers the anisotropic nature of formation 432 (a "vertically transverse isotropic (VTI) model") and a model that assumes that formation 432 is isotropic ("an isotropic model"). The comparisons are shown in FIGS. 5A-6 and 8A-9 and use four datasets of published data obtained using either laboratory measurements or theoretical models. The first dataset is a computed dataset for fractured Marcellus shale (labeled "Marcellus" in FIGS. 5A-6 and FIGS. 8A-9). The second and third datasets are measured from phenolic sheet stacks having near orthorhombic properties (labeled "Phenolic1" and "Phenolic2" in FIGS. 5A-6 and FIGS. 8A-9). The fourth dataset is theoretically computed based on a vertically fractured formation (labeled "Schbg-Hbg" in FIGS. 5A-6 and FIGS. 8A-9). The use of four datasets provides a comparison of the geomechanical model for various orthorhombic media.

FIGS. 5A and 5B illustrate graphs of the errors in the maximum and minimum horizontal stresses, respectively, introduced during the use of simplified methods of calculating the stresses for the wellbore shown in FIG. 4. To calculate the stresses using the VTI model, $C_{22}$ is assumed to be equal to $C_{11}$ and $C_{23}$ is assumed to be equal to $C_{13}$. For the isotropic model, $C_{22}$ is assumed to be equal to $C_{11}$, $C_{23}$ is assumed to be equal to $C_{13}$, $C_{12}$ is assumed to be equal to $C_{13}$, and $C_{33}$ is assumed to be equal to $C_{11}$. For all three models, the properties of formation 432 are assumed to be:

$\sigma_v$=7250 psi;

P=3600 psi;

$\varepsilon_h$=0.2 mm;

$\varepsilon_H$=0.4 mm; and

α=0.7.

In FIG. 5A, curve 540a shows the difference between the maximum horizontal stress calculated by the disclosed geomechanical model and the maximum horizontal stress calculated by the VTI model. Curve 542a shows the difference between the maximum horizontal stress calculated by the disclosed geomechanical model and the maximum horizontal stress calculated by the isotropic model. In FIG. 5B, curve 540b shows the difference between the minimum horizontal stress calculated by the disclosed geomechanical model and the minimum horizontal stress calculated by the VTI model. Curve 542b shows the difference between the minimum horizontal stress calculated by the disclosed geomechanical model and the minimum horizontal stress calculated by the isotropic model. As shown in FIG. 5A, both the isotropic model and the VTI model underestimate the fracture closure pressure, $\sigma_H$, such that if either of those models are used to design the subterranean operation, the pressure of the fracturing fluid may be too low to create fractures in formation 432. FIG. 5B illustrates that the VTI model may be used to accurately predict the minimum horizontal stress while the isotropic model may introduce error in the calculation of the minimum horizontal stress. Due to the increased accuracy of the disclosed geomechanical model, the pressure of the fracturing fluid may be more accurately selected to increase the efficiency of the subterranean operation.

The stress anisotropy is the difference between the maximum horizontal stress and the minimum horizontal stress. FIG. 6 illustrates a graph of the stress anisotropy calculated for the wellbore shown in FIG. 4 with a geomechanical model, a VTI model, and an isotropic model. The stress anisotropy calculated with the geomechanical model, as shown by curve 644*a*, is higher than the stress anisotropy calculated with the VTI model and the isotropic model, shown by curves 644*b* and 644*c*, respectively. Therefore, both the VTI model and the isotropic model underestimate the anisotropy stress and the use of either the VTI model or the isotropic model may result in using a fracturing fluid at a pressure that may not perform effective fracturing of formation 432.

Figure 7:
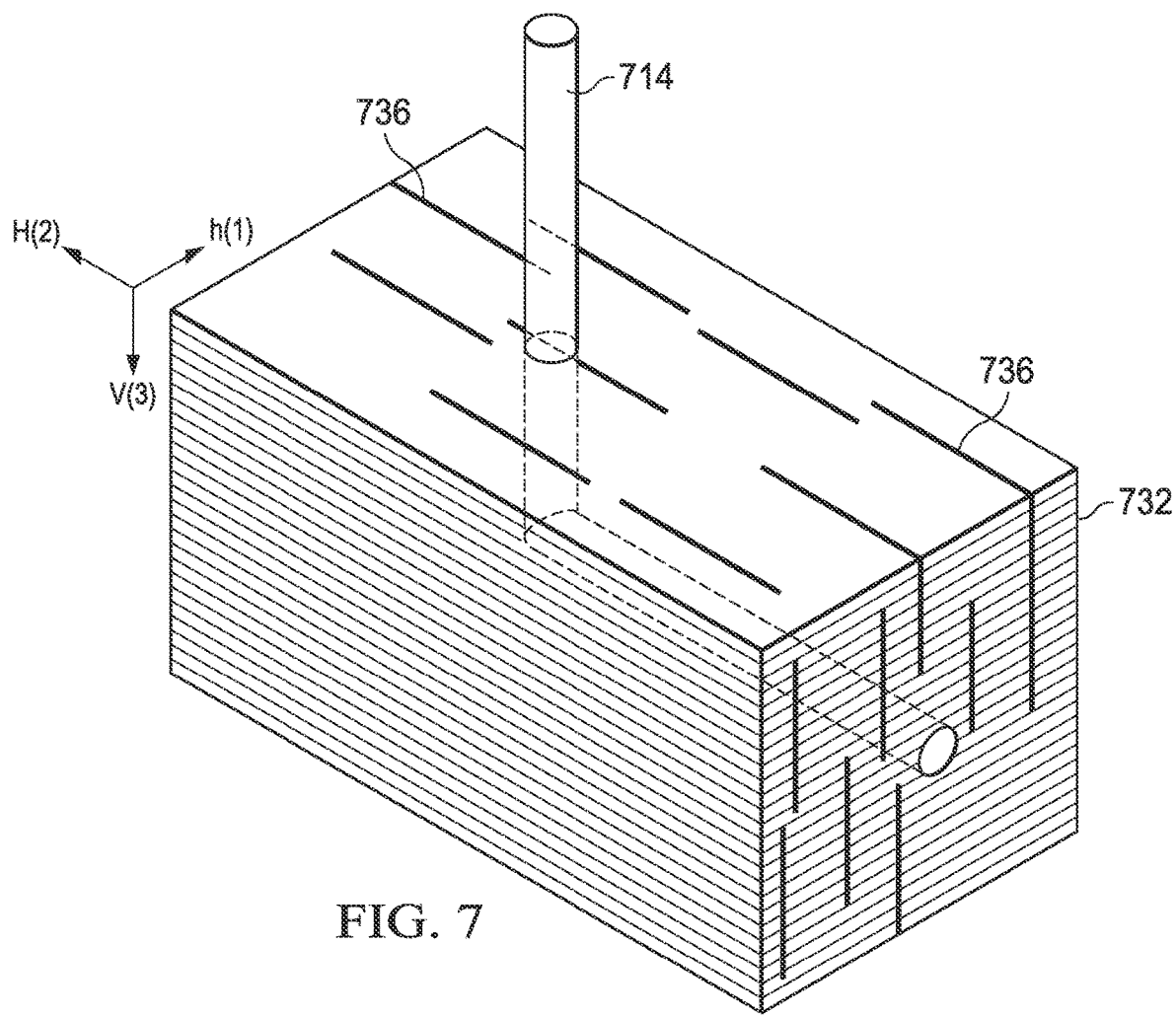
FIG. 7 illustrates an isometric view of an exemplary subterranean operation with a horizontal well drilled parallel to the dominant fractures in the formation.

As another example of a subterranean operation, FIG. 7 illustrates an isometric view of an exemplary subterranean operation with a horizontal well drilled parallel to the dominant fractures in the fractures. Wellbore 714 may be drilled vertically to a predetermined depth and then drilled horizontally through formation 732 in a direction parallel to dominant fractures 736. The coordinate system shown in FIG. 7 is oriented such that the H-direction corresponds to the direction of dominant fractures 736. Because wellbore 714 is drilled parallel to dominant fractures 736, it may also be parallel to the direction of the maximum horizontal stress, $\sigma_H$.

FIGS. 8A and 8B illustrate graphs of the errors in the maximum and minimum horizontal stresses, respectively, introduced during the use of simplified methods of calculating the stresses for the wellbore shown in FIG. 7. To calculate the stresses using the VTI model, $C_{22}$ is assumed to be equal to $C_{11}$ and $C_{23}$ is assumed to be equal to $C_{13}$. For the isotropic model, $C_{22}$ is assumed to be equal to $C_{11}$, $C_{23}$ is assumed to be equal to $C_{13}$, $C_{12}$ is assumed to be equal to $C_{13}$, and $C_{33}$ is assumed to be equal to $C_{22}$. For all three models, the properties of formation 732 are assumed to be:

$\sigma_V$=7250 psi;

$P$=3600 psi;

$\varepsilon_h$=0.2 mm;

$\varepsilon_H$=0.4 mm; and $\alpha$=0.7.

In FIG. 8A, curve 840*a* shows the difference between the maximum horizontal stress calculated by the disclosed geomechanical model and the maximum horizontal stress calculated by the VTI model. Curve 842*a* shows the difference between the maximum horizontal stress calculated by the disclosed geomechanical model and the maximum horizontal stress calculated by the isotropic model. In FIG. 8B, curve 840*b* shows the difference between the minimum horizontal stress calculated by the disclosed geomechanical model and the minimum horizontal stress calculated by the VTI model. Curve 842*b* shows the difference between the minimum horizontal stress calculated by the disclosed geomechanical model and the minimum horizontal stress calculated by the isotropic model. As shown in FIG. 8A, the VTI model may be used to accurately predict the maximum horizontal stress while the isotropic model may underestimate the maximum horizontal stress such that if the isotropic model is used to design the subterranean operation, the pressure of the fracturing fluid may be too low to fracture formation 732. FIG. 8B illustrates that the isotropic model may underestimate the minimum horizontal stress and the VTI model overestimates the minimum horizontal stress.

The improved accuracy of the disclosed geomechanical model may allow the pressure of the fracturing fluid to be more accurately selected to increase the efficiency and effectiveness of the subterranean operation.

Figure 9:
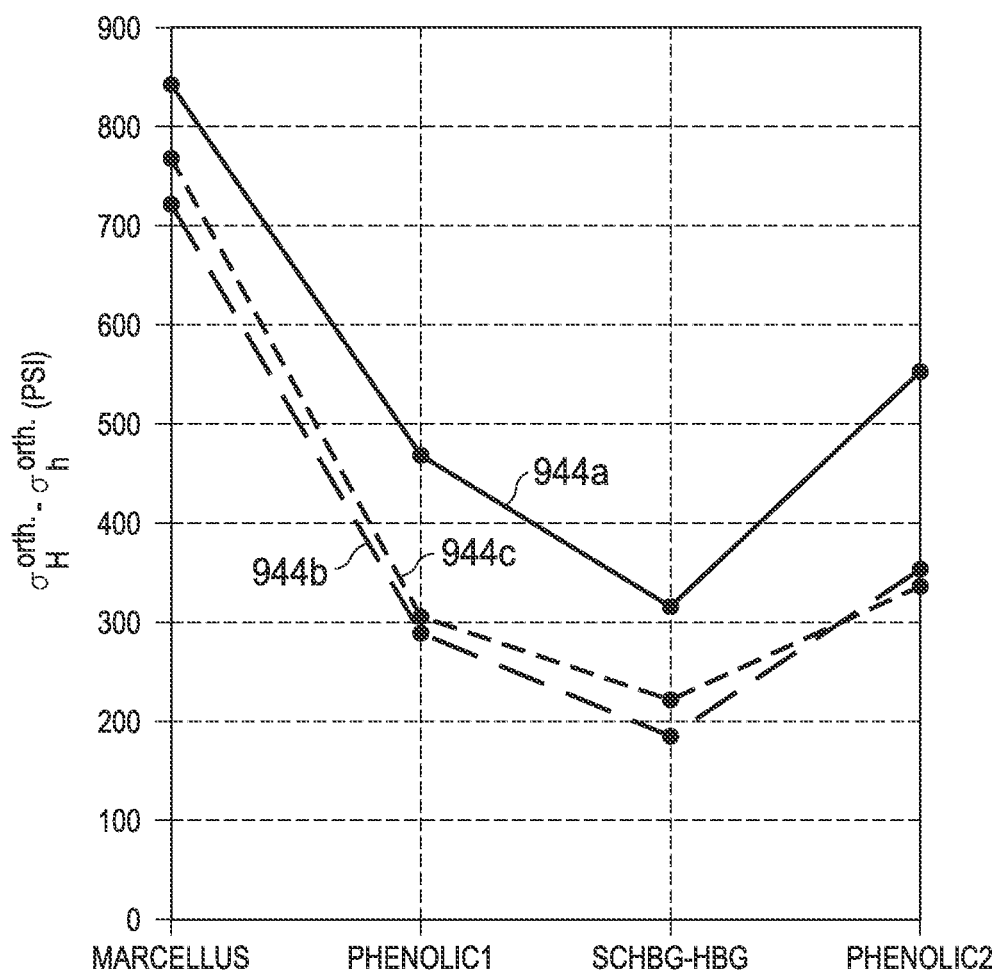
FIG. 9 illustrates a graph of the stress anisotropy calculated for the wellbore shown in FIG. 7 with a geomechanical model, a VTI model, and an isotropic model.

FIG. 9 illustrates a graph of the stress anisotropy calculated for the wellbore shown in FIG. 7 with a geomechanical model, a VTI model, and an isotropic model. The stress anisotropy calculated with the geomechanical model, as shown by curve 944*a*, is higher than the stress anisotropy calculated with the VTI model and the isotropic model, shown by curves 944*b* and 944*c*, respectively. Therefore, both the VTI model and the isotropic model underestimate the anisotropy stress and the use of either the VTI model or the isotropic model may result in using a fracturing fluid at a pressure that may not perform effective fracturing of formation 732.

The maximum horizontal stress, $\sigma_H$, also known as the fracture closure pressure may be used to determine the pressure of the fracturing fluid injected into a wellbore (e.g., wellbore 102, 424, or 724 shown in FIGS. 1, 4, and 7, respectively). In some embodiments, the stresses may be calculated in real-time or in near real-time during the subterranean operation. In other embodiments, the stresses may be calculated prior to the start of the subterranean operation. The stresses may be based on stiffness coefficients (e.g., Equation 12) generated from models. The models used to create the stiffness coefficients may be based on information known about the formation (e.g., formation 104, 432, or 732 shown in FIGS. 1, 4, and 7, respectively), and may be calculated prior to the start of the subterranean operation. The calculated stresses may be used to calculate the pressure of the fracturing fluid, which may be calculated prior to the start of the subterranean operation or during the subterranean operation. Embodiments disclosed herein include:

A. A method for generating a geomechanical model of a formation for use during a subterranean operation including retrieving a stiffness coefficient matrix for a formation to be fractured, generating a geomechanical model of the formation based on a set of natural fractures and an anisotropic behavior of the formation, calculating a mechanical property of the formation based on the model and the stiffness coefficient matrix, and fracturing the formation with a fracturing fluid, a pressure of the fracturing fluid based on the mechanical property.

B. A hydraulic fracturing system including a wellbore formed in a formation, a fracturing fluid injection system, and a fracturing fluid. A pressure of the fracturing fluid is determined by retrieving a stiffness coefficient matrix for a formation to be fractured, generating a geomechanical model of the formation based on a set of natural fractures and an anisotropic behavior of the formation, calculating a mechanical property of the formation based on the model and the stiffness coefficient matrix, determining a pressure of the fracturing fluid based on the mechanical property, and fracturing the formation with a fracturing fluid, a pressure of the fracturing fluid based on the mechanical property.

C. A non-transitory machine-readable medium including instructions stored therein. The instructions are executable by one or more processors to facilitate performing a method of forming a wellbore. The method includes retrieving a stiffness coefficient matrix for a formation to be fractured, generating a geomechanical model of the formation based on a set of natural fractures and an anisotropic behavior of the formation, calculating a mechanical property of the formation based on the model and the stiffness coefficient matrix, and fracturing the formation with a fracturing fluid, a pressure of the fracturing fluid based on the mechanical property.

Each of embodiments A, B, and C may have one or more of the following additional elements in any combination: Element 1: wherein the mechanical property is at least one of a minimum horizontal stress, a maximum horizontal stress, a Poisson's ratio, and a Young's modulus. Element 2: wherein the formation is a horizontally laminated formation. Element 3: wherein calculating the mechanical property of the formation is performed in real-time during a subterranean operation. Element 4: wherein the set of natural fractures is a set of vertical natural fractures. Element 5: wherein the set of natural fractures includes a first set of natural fractures and a second set of natural fractures. Element 6: wherein the first set of the natural fractures is orthogonal to the second set of natural fractures.

Although the present disclosure and its advantages have been described in detail, it should be understood that various changes, substitutions and alterations can be made herein without departing from the spirit and scope of the disclosure as defined by the following claims. It is intended that the present disclosure encompasses such changes and modifications as fall within the scope of the appended claims.

What is claimed is:

1. A method for generating a geomechanical model of a formation for use during a subterranean operation, comprising:
   retrieving a stiffness coefficient matrix for a formation to be fractured;
   generating a geomechanical model of the formation based on a set of natural fractures and an anisotropic behavior of the formation;
   calculating a maximum horizontal stress of the formation based on the geomechanical model and the stiffness coefficient matrix;
   determining a fracture closure pressure of the formation based on the maximum horizontal stress;
   drilling a wellbore horizontally through the formation in a direction perpendicular to the maximum horizontal stress of the formation; and
   fracturing the formation inside the wellbore with a fracturing fluid, a pressure of the fracturing fluid based on the fracture closure pressure.

2. The method of claim 1, wherein determining the fracture closure pressure of the formation further comprises:
   calculating a mechanical property based on the geomechanical model, the mechanical property including at least one of a minimum horizontal stress, a Poisson's ratio, and a Young's modulus; and
   using the mechanical property to determine the fracture closure pressure.

3. The method of claim 1, wherein the formation is a horizontally laminated formation.

4. The method of claim 1, wherein calculating the maximum horizontal stress of the formation is performed in real-time during a subterranean operation.

5. The method of claim 1, wherein the set of natural fractures is a set of vertical natural fractures.

6. The method of claim 1, wherein the set of natural fractures includes a first set of natural fractures and a second set of natural fractures.

7. The method of claim 6, wherein the first set of the natural fractures is orthogonal to the second set of natural fractures.

8. A hydraulic fracturing system, comprising:
   a wellbore formed in a formation;
   a fracturing fluid injection system; and
   a fracturing fluid, a pressure of the fracturing fluid determined by:
   retrieving a stiffness coefficient matrix for a formation to be fractured;
   generating a geomechanical model of the formation based on a set of natural fractures and an anisotropic behavior of the formation;
   calculating a maximum horizontal stress of the formation based on the geomechanical model and the stiffness coefficient matrix;
   determining a fracture closure pressure of the formation based on the maximum horizontal stress;
   drilling the wellbore horizontally through the formation in a direction perpendicular to the maximum horizontal stress of the formation; and
   fracturing the formation inside the wellbore with the fracturing fluid, the pressure of the fracturing fluid based on the fracture closure pressure.

9. The hydraulic fracturing system of claim 8, wherein determining the fracture closure pressure of the formation further comprises:
   calculating a mechanical property based on the geomechanical model, the mechanical property including at least one of a minimum horizontal stress, a Poisson's ratio, and a Young's modulus; and
   using the mechanical property to determine the fracture closure pressure.

10. The hydraulic fracturing system of claim 8, wherein the formation is a horizontally laminated formation.

11. The hydraulic fracturing system of claim 8, wherein calculating the maximum horizontal stress of the formation is performed in real-time during a subterranean operation.

12. The hydraulic fracturing system of claim 8, wherein the set of natural fractures is a set of vertical natural fractures.

13. The hydraulic fracturing system of claim 8, wherein the set of natural fractures includes a first set of natural fractures and a second set of natural fractures.

14. The hydraulic fracturing system of claim 13, wherein the first set of the natural fractures is orthogonal to the second set of natural fractures.

15. A non-transitory machine-readable medium comprising instructions stored therein, the instructions executable by one or more processors to facilitate performing a method of forming a wellbore, the method comprising:
   retrieving a stiffness coefficient matrix for a formation to be fractured;
   generating a geomechanical model of the formation based on a set of natural fractures and an anisotropic behavior of the formation;
   calculating a maximum horizontal stress of the formation based on the geomechanical model and the stiffness coefficient matrix;
   determining a fracture closure pressure of the formation based on the maximum horizontal stress;
   drilling the wellbore horizontally through the formation in a direction perpendicular to the maximum horizontal stress of the formation; and
   fracturing the formation inside the wellbore with a fracturing fluid, a pressure of the fracturing fluid based on the fracture closure pressure.

16. The non-transitory machine-readable medium of claim 15, wherein determining the fracture closure pressure of the formation further comprises:

calculating a mechanical property based on the geomechanical model, the mechanical property including at least one of a minimum horizontal stress, a Poisson's ratio, and a Young's modulus; and using the mechanical property to determine the fracture closure pressure.

17. The non-transitory machine-readable medium of claim 15, wherein the formation is a horizontally laminated formation.

18. The non-transitory machine-readable medium of claim 15, wherein calculating the maximum horizontal stress of the formation is performed in real-time during a subterranean operation.

19. The non-transitory machine-readable medium of claim 15, wherein the set of natural fractures includes a first set of vertical natural fractures and a second set of vertical natural fractures.

20. The non-transitory machine-readable medium of claim 19, wherein the first set of vertical natural fractures is orthogonal to the second set of vertical natural fractures.

* * * * *